United States Patent [19]

Izu et al.

[11] Patent Number: 4,464,823
[45] Date of Patent: Aug. 14, 1984

[54] METHOD FOR ELIMINATING SHORT AND LATENT SHORT CIRCUIT CURRENT PATHS IN PHOTOVOLTAIC DEVICES

[75] Inventors: Masatsugu Izu, Birmingham; Vincent D. Cannella, Detroit, both of Mich.

[73] Assignee: Energy Conversion Devices, Inc., Troy, Mich.

[21] Appl. No.: 520,054

[22] Filed: Aug. 3, 1983

Related U.S. Application Data

[63] Continuation-in-part of Ser. No. 435,890, Oct. 21, 1982.

[51] Int. Cl.³ .............................................. H01L 31/18
[52] U.S. Cl. ......................................... 29/572; 29/574; 29/575; 29/584; 136/290; 156/627; 204/129.2; 204/129.3; 204/129.55; 204/129.6
[58] Field of Search ................ 29/572, 574, 575, 584; 136/258 AM, 258 PC, 290; 156/627; 204/129.2, 129.55, 129.75, 129.3, 129.6; 427/8

[56] References Cited

U.S. PATENT DOCUMENTS

| | | | |
|---|---|---|---|
| 4,166,918 | 9/1979 | Nostrand | 136/243 |
| 4,301,409 | 11/1981 | Miller et al. | 324/158 D |
| 4,385,971 | 5/1983 | Swartz | 204/129.1 |
| 4,419,530 | 12/1983 | Nath | 136/251 |
| 4,420,497 | 12/1983 | Tickle | 427/8 |

FOREIGN PATENT DOCUMENTS

| | | | |
|---|---|---|---|
| 56-69872 | 6/1981 | Japan | 136/290 |
| 56-69873 | 6/1981 | Japan | 136/290 |
| 57-56941 | 4/1982 | Japan | 29/574 |

Primary Examiner—Aaron Weisstuch
Attorney, Agent, or Firm—Lawrence G. Norris

[57] ABSTRACT

Systems and methods for detecting and eliminating latent and existing short circuit current paths through photovoltaic devices of the type including at least one semiconductor region overlying a substrate and a layer of conductive light transmissive material overlying the at least one semiconductor region are disclosed. The latent paths are first converted to existing short circuit current paths by applying a bias voltage to the devices. The short circuit current paths which are eliminated extend through the at least one semiconductor region from the substrate to the layer of conductive light transmissive material. The resistivity of the short circuit current paths is increased substantially at the interface between the conductive light transmissive material and the semiconductor region by isolating electrically the conductive light transmissive material from the short circuit current path.

The isolation can be provided by removing the transparent conductive material from electrical contact or connection with the short circuit current path. The isolation also can be provided by depositing a body of insulating material onto the semiconductor region over an area including a short circuit current path prior to the deposition of the conductive light transmissive material. Further, the short circuit current path can be detected and located by applying a voltage to discrete areas of the device through a conductive solution which path then can be eliminated as described above.

21 Claims, 12 Drawing Figures

4,464,823

1

METHOD FOR ELIMINATING SHORT AND LATENT SHORT CIRCUIT CURRENT PATHS IN PHOTOVOLTAIC DEVICES

RELATED APPLICATION

This is a continuation-in-part of pending application Ser. No. 435,890, filed Oct. 21, 1982, for System and Method for Eliminating Short Circuit Current Paths in Photovoltaic Devices.

FIELD OF THE INVENTION

This invention relates to improved methods and systems for detecting and eliminating short circuit current paths in photovoltaic devices including latent short circuit paths. The systems and methods of the invention are most particularly adapted for use in making large area amorphous semiconductor photovoltaic devices.

BACKGROUND OF THE INVENTION

This invention includes methods and systems for detecting and eliminating latent short circuit current paths in photovoltaic devices and can be employed in or with systems for the continuous production of photovoltaic devices wherein successive amorphous alloy semiconductor layers are continuously deposited on a substrate moving through each of a plurality of deposition chambers.

Recently, considerable efforts have been made to develop systems for depositing amorphous semiconductor alloys, each of which can encompass relatively large areas, and which can be doped to form p-type and n-type materials for the production of p-i-n and other type devices which are, in operation in photovoltaic and other applications, substantially equivalent to their crystalline counterparts.

It is now possible to prepare amorphous alloys by glow discharge techniques that have (1) acceptable concentrations of localized states in the energy gaps thereof, and (2) provide high quality electronic properties. This technique is fully described in U.S. Pat. No. 4,226,898, Amorphous Semiconductors Equivalent To Crystalline Semiconductors, which issued Oct. 7, 1980 in the names of Stanford R. Ovshinsky and Arun Madan, and by vapor deposition as fully described in U.S. Pat. No. 4,217,374, which issued on Aug. 12, 1980 in the names of Stanford R. Ovshinsky and Masutsugu Izu, under the same title. As disclosed in these patents, fluorine introduced into the amorphous semiconductor operates to substantially reduce the density of the localized defect states therein and facilitates the addition of other alloying materials.

The concept of utilizing multiple cells, to enhance photovoltaic device efficiency, was discussed at least as early as 1955 by E. D. Jackson, U.S. Pat. No. 2,949,498 issued Aug. 16, 1960. The multiple cell structures therein discussed utilized p-n junction crystalline semiconductor devices. Essentially the concept is directed to utilizing different band gap devices to more efficiently collect various portions of the solar spectrum and to increase open circuit voltage (Voc). The tandem cell device has two or more cells with the light directed serially through each cell, with a large band gap material followed by one or more smaller band gap materials to absorb the light passed through the preceeding cell or layer. Multiple cell devices are also disclosed in pending patent application Ser. No. 427,757, filed Sept. 29, 1982, for Multiple Cell Photo-responsive Amorphous Alloys and Devices.

It is of great commercial importance to be able to mass produce photovoltaic devices. Unlike crystalline silicon which is limited to batch processing for the manufacture of solar cells, amorphous silicon alloys can now be deposited in multiple layers over large area substrates to form solar cells in a high volume, continuous processing system. Continuous processing systems of this kind are disclosed, for example, in pending patent applications: Ser. No. 151,301, filed May 19, 1980, for A Method Of Making P-Doped Silicon Films And Devices Made Therefrom, now U.S. Pat. No. 4,400,409, issued Aug. 23, 1983; Ser. No. 244,386, filed Mar. 16, 1981, for Continuous Systems For Depositing Amorphous Semiconductor Material; Ser. No. 240,493, filed Mar. 16, 1981, for Continuous Amorphous Solar Cell Production System, now U.S. Pat. No. 4,410,558, issued Oct. 18, 1983; Ser. No. 306,146, filed Sept. 28, 1981, for Multiple Chamber Deposition And Isolation System and Method, now U.S. Pat. No. 4,438,723, issued Mar. 27, 1984; and Ser. No. 359,825, filed Mar. 19, 1982, for Method And Apparatus For Continuously Producing Tandem Amorphous Photovoltaic Cells. As disclosed in these patents and patent applications, a substrate formed from stainless steel, for example, may be continuously advanced through a succession of deposition chambers, wherein each chamber is dedicated to the deposition of a specific material.

In making a solar cell of p-i-n type configuration, the first chamber is dedicated for depositing a p-type amorphous alloy, the second chamber is dedicated for depositing an intrinsic amorphous alloy, and the third chamber is dedicated for depositing an n-type amorphous alloy. Since each deposited alloy, and especially the intrinsic alloy must be of high purity, the deposition environment in the intrinsic deposition chamber is isolated from the doping constituents within the other chambers to prevent the diffusion of doping constituents into the intrinsic chamber. In the previously mentioned patent applications, wherein the systems are primarily concerned with the production of photovoltaic cells, isolation between the chambers is accomplished by gas gates through which unidirectional gas flow is established and through which an inert gas may be "swept" about the web of substrate material.

In the previously mentioned patents and patent applications, deposition of the amorphous alloy materials onto the large area continuous substrate is accomplished by glow discharge decomposition of the process gases. Even though careful measures are taken to form devices having amorphous semiconductor alloys of high quality, there remains a finite probability that over a given device surface area, short circuit current paths through the amorphous semiconductor alloys can exist. These short circuit current paths are deleterious to obtaining optimum performance from the devices. The reason for the non-optimum performance is that such devices are customarily provided with a layer of transparent conductive material over the last deposited amorphous semiconductor layer to form a top contact of the device to permit collection of the photo generated charge carriers as electrical current, while permitting the light photon energy to pass therethrough into the active region or regions of the device for the generation of the charge carriers. Since this last layer is conductive, just one short circuit current path through the device can greatly limit the voltage obtainable over a rather large area of the device. Hence, device voltage output and efficiency can be substantially reduced by virtue of such short circuit current paths. It is to the detection and elimination of these short circuit current paths that the parent application, Ser. No. 435,890, is directed.

One attempt to eliminate short circuit current paths within photovoltaic devices, described in U.S. Pat. No. 4,166,918, involves the application of a reverse bias voltage to the device in order to burn out the defects. It is therein stated that application of the reverse bias without a cermet layer increases the incidence of shorts, and shorts can lead to cell breakdown.

The system and method of the parent application, in contrast, have been found to totally eliminate existing short circuit current paths in photovoltaic devices. In addition, the system and method of the parent application even eliminate substrate related short circuit current paths whether due to substrate irregularities or the presence of a roughened substrate surface to form a diffuse back reflector, such as disclosed in copending U.S. application Ser. No. 354,285, filed Mar. 3, 1982, for Improved Photovoltaic Device Having Incident Radiation Directing Means For Total Internal Reflection, now U.S. Pat. No. 4,419,533, issued Dec. 6, 1983. Furthermore, the system and method of the parent application and the present invention are directly applicable to continuous process manufacturing techniques including the continuous production of multiple cell devices.

Although the parent application succeeds in eliminating existing short circuit current paths, it has been found that latent short circuit paths can exist which become actuated after a period of operation. These latent short circuit current paths can exist after the elimination of the existing short circuit current paths by the system and method of the parent application. The present invention has been found to actuate these latent short circuit current paths into existing short circuit current paths which then can be eliminated.

SUMMARY OF THE INVENTION

The invention provides systems and methods for detecting and eliminating pre-existing and latent short circuit current paths in photovoltaic devices of the type including at least one semiconductor region overlying a substrate and a layer of conductive light transmissive material overlying the at least one semiconductor region. The pre-existing short circuit current paths which are eliminated extend through the at least one semiconductor region from the substrate to the layer of conductive light transmissive material. The latent short circuit paths are converted to existing short circuit current paths and then eliminated. To eliminate the short circuit current paths in accordance with the invention, the resistivity of the short circuit current paths is increased substantially at the interface between the conductive light transmissive material and the semiconductor region by isolating electrically the conductive light transmissive material from the short circuit current path.

In accordance with one embodiment of the invention, the photovoltaic device is first biased to convert the latent short circuit current paths to existing short circuit current paths. A bias of from about two volts to ten volts per cell is suitable for this purpose. The bias can be applied directly to the devices with electrodes connected between the substrate and the conductive light transmissive material or indirectly through a conductive solution. Isolation is then provided by removing the transparent conductive material from electrical contact or connection with the short circuit current path. This is accomplished, for example, by applying a dilute electrolyte solution to the conductive light transmissive material and passing a current through the short circuit current path and the electrolyte. This causes the conductive transparent material to be etched until sufficient conductive transparent material is removed to electrically isolate the conductive transparent material from the short circuit current path. In accordance with another embodiment of the invention, the isolation is provided by depositing a body of insulating material onto the semiconductor region over an area including a short circuit current path prior to the deposition of the conductive light transmissive material.

In accordance with a further embodiment of the invention, the short circuit current path can be detected and located by applying a voltage to discrete areas of the device through a conductive solution. When the current flowing through the solution is greater than a predetermined level, a short circuit current path is located. The short circuit current path is subsequently eliminated by the application of an appropriate voltage and current through a conductive etchant solution. Thereafter, an insulating material can be applied to the etched areas.

The foregoing can form part of a continuous or batch production system for making photovoltaic devices or can be performed at a location remote from the continuous or batch production system. A plurality of sources of electrolyte, each making discrete surface area contact with the conductive light transmissive material and arranged in side-by-side relation can be provided so that the device can by continuously moved through the system for the continuous detection and elimination of short circuit current paths across the entire width and length of the device. Alternately, a single, elongated electrolyte source extending across the entire width of the device can be employed to eliminate the short circuit current paths in accordance with the invention as the device is continuously passed by the electrolyte source.

DETAILED DESCRIPTION OF THE DRAWINGS

I. The Photovoltaic Cell

Figure 1:
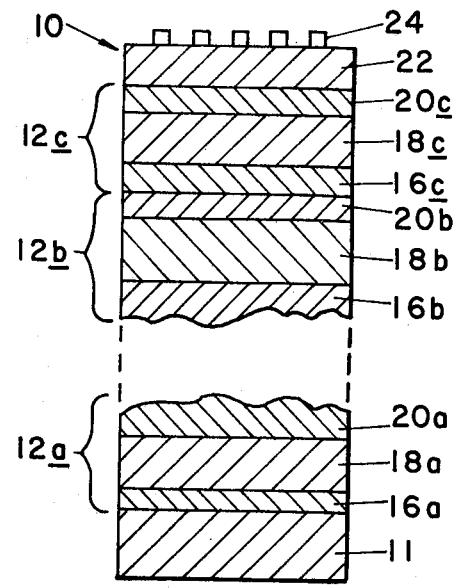
FIG. 1 is a fragmentary, cross-sectional view of a fully processed tandem or cascade photovoltaic device comprising a plurality of p-i-n type cells, each layer of the cells formed from an amorphous semiconductor alloy.

Referring now to the drawings and particularly to FIG. 1, a photovoltaic cell, formed of a plurality of successive p-i-n layers, each of which includes an amorphous semiconductor alloy, is shown generally by the numeral 10. It is for the production of this type of photovoltaic device, wherein amorphous alloy layers are continuously deposited onto a moving web of substrate material in successive isolated deposition chambers, that the present invention is particularly applicable.

More particularly, FIG. 1 shows a p-i-n type photovoltaic device such as a solar cell made up of individual p-i-n type cells 12a, 12b and 12c. Below the lower most cell 12a is a substrate 11 which may be preferably formed from a conductive metallic material such as stainless steel, aluminum, tantalum, molybdenum or chrome. The substrate can also include a nonconductive base having a layer or layers of conductive material deposited thereon. For purposes of this application, the term "substrate" shall include both rigid and flexible substrates and also any conductive layers added thereto by preliminary processing.

Each of the cells 12a, 12b and 12c are fabricated with an amorphous alloy semiconductor region or body. Each of the alloy bodies includes an n-type conductivity region or layer 20a, 20b and 20c; an intrinsic region or layer 18a, 18b and 18c; and a p-type conductivity region or layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although p-i-n cells are illustrated, the short circuit detecting and eliminating system of this invention may also be applied in producing single or multiple n-i-p cells as well.

Following the deposition of the semiconductor alloy layers, a further deposition process may be performed either in a separate environment or as a part of a continuous process. In this step, a transparent or semiconductor layer 22 of conductive light transmissive material such as a TCO (transparent conductive oxide) of, for example, an alloy of indium, tin, and oxygen (ITO) is added. After the detection and elimination of short circuit current paths through the device as will be described hereinafter in accordance with one embodiment of the present invention, an electrode grid 24 may be added to the device where the cell is of a sufficiently large area, or if the conductivity of the TCO layer 22 is insufficient. The grid 24 shortens the carrier path and increases the collection efficiency.

II. The Multiple Glow Discharge Deposition Chambers

Figure 2:
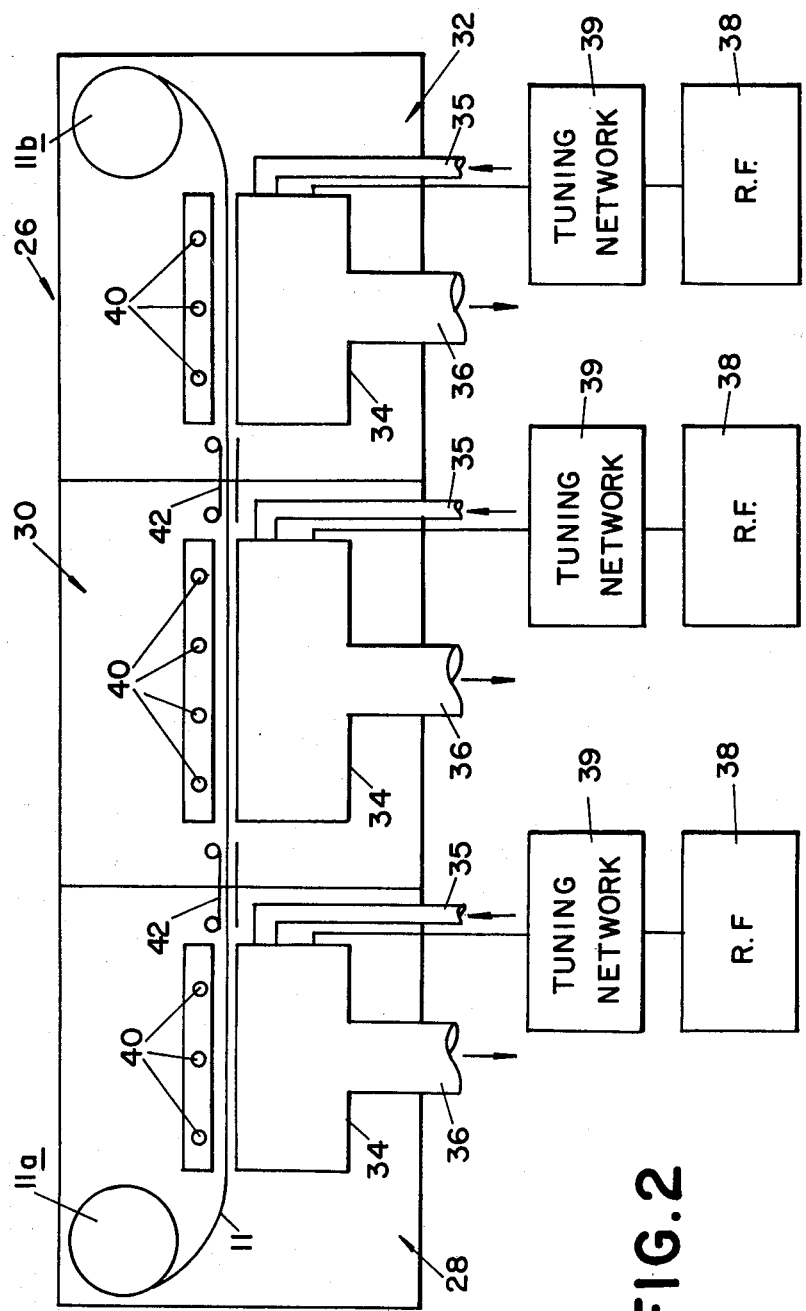
FIG. 2 is a diagrammatic representation of a multiple glow discharge chamber deposition system adapted for the continuous production of the photovoltaic devices shown in FIG. 1.

Turning now to FIG. 2, a diagrammatic representation of a multiple glow discharge chamber deposition apparatus for the continuous production of photovoltaic cells is generally illustrated by the reference numeral 26. The apparatus 26 includes a plurality of isolated, dedicated deposition chambers, each chamber of which is interconnected by a gas gate through which a sweep gas flows in a non-violent manner.

The apparatus 26 is adapted to produce a high volume of large area, amorphous photovoltaic cells having a p-i-n configuration on the deposition surface of a substrate material 11 which is continually fed therethrough. To deposit the amorphous alloy layers required for producing multiple p-i-n type layer cells, the apparatus 26 includes at least one triad of deposition chambers. Each triad comprises: a first deposition chamber 28 in which a p-type conductivity amorphous alloy layer is deposited onto the deposition surface of the substrate 11 as the substrate 11 passes therethrough; a second deposition chamber 30 in which an intrinsic amorphous alloy layer is deposited atop the p-type alloy layer on the deposition surface of the substrate 11 as the substrate 11 passes therethrough; and a third deposition chamber 32 in which an n-type conductivity alloy layer is deposited atop the intrinsic layer on the deposition surface of the substrate 11 as the substrate 11 passes therethrough. Although, only one triad of deposition chambers has been illustrated, as disclosed in the aforementioned application Ser. No. 359,825, additional triads or additional individual chambers may be added to the apparatus to provide the machine with the capability of producing photovoltaic cells having any number of amorphous p-i-n type layers with the appropriate layer thicknesses. The substrate supply core 11a and the substrate take-up core 11b are shown in the deposition chambers for illustrative purposes only, while in reality the cores would be housed in separate chambers operatively connected to the deposition chambers.

Each deposition chamber 28, 30 and 32 of the triad is adapted to deposit a single amorphous silicon alloy, by glow discharge deposition onto the conductive substrate 11. To that end, each of the deposition chambers 28, 30 and 32 includes: an electrode assembly 34; a gas supply conduit 35; an out gassing conduit 36; a radio frequency generator 38; a tuning network 39; a plurality of radiant heating elements 40; and a gas gate 42 operatively connecting the intrinsic deposition chamber to each of the dopant chambers. The supply conduits 35 are operatively associated with the respective electrode assemblies 34 to deliver process gas mixtures to the plasma regions created in each deposition chamber.

The radio frequency generators 38 operate in conjunction with the electrode assemblies 34, the radiant heaters 40 and the grounded substrate 11 to form the plasma regions by dissociating the elemental reaction gases entering the deposition chambers into deposition species. The deposition species are then deposited onto a surface of the substrate 11 as amorphous semiconductor layers.

The tuning networks 39 match the output impedance of the generators 38 to the input impedance of the electrode assemblies 34. This provides efficient power transfer between the generators 38 and the electrode assemblies 34.

To form the photovoltaic cell 10 illustrated in FIG. 1, a p-type amorphous layer is deposited onto the substrate 11 in the deposition chamber 28, an intrinsic amorphous alloy layer is deposited atop the p-type layer in the deposition chamber 30 and an n-type amorphous alloy layer is deposited atop the intrinsic layer in the deposition chamber 32. As a result, the apparatus 26 deposits at least three amorphous alloy layers onto the substrate 11 wherein the intrinsic layer deposited in deposition chamber 30 differs in composition from the layers deposited in deposition chambers 28 and 32 by the absence of at least one element which will be referred to as the dopant or doping species. The cell 10 can include silicon alloys, germanium alloys and alloys containing silicon and germanium as desired.

It is important that each of the alloy layers (and particularly the intrinsic layer) deposited onto a surface of the substrate 11 be of high purity in order to produce high efficiency photovoltaic devices 10. The gas gates 42 substantially prevent the back diffusion of process gases from adjacent chambers to isolate each chamber from one another.

III. The Short Circuit Current Path Detector and Eliminator

Figure 3:
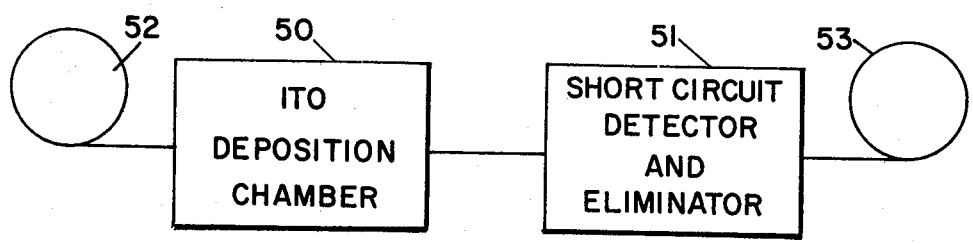
FIG. 3 is a schematic representation of a deposition chamber for forming the layer of conductive light transmissive material and a system for detecting and eliminating short circuit current paths in accordance with one embodiment of the present invention.

Referring now to FIG. 3, it illustrates in schematic form a deposition chamber 50 for depositing the ITO onto the last deposited amorphous silicon alloy layer for forming the layer of transparent conductive material on the device and a system 51 for detecting and eliminating existing and latent short circuit current paths. A supply core 52 contains the photovoltaic devices processed by the apparatus of FIG. 2 and the devices are fed through the chamber 50 and system 51 to a take-up core 53. After processing, the core 53 can be removed and transferred to a further station for final processing.

Although the apparatus of FIG. 3 is shown separate from the apparatus of FIG. 2, it must be understood that the chamber 50 can immediately succeed the last chamber 32 of FIG. 2 eliminating the core 52. In this case the substrate, which now contains the layers of amorphous silicon alloys forming the device, can be continuously advanced from the chamber 32 to the chamber 50. Also, batch produced devices can be processed individually in succession in the chamber 50 and system 51.

Figure 4A:
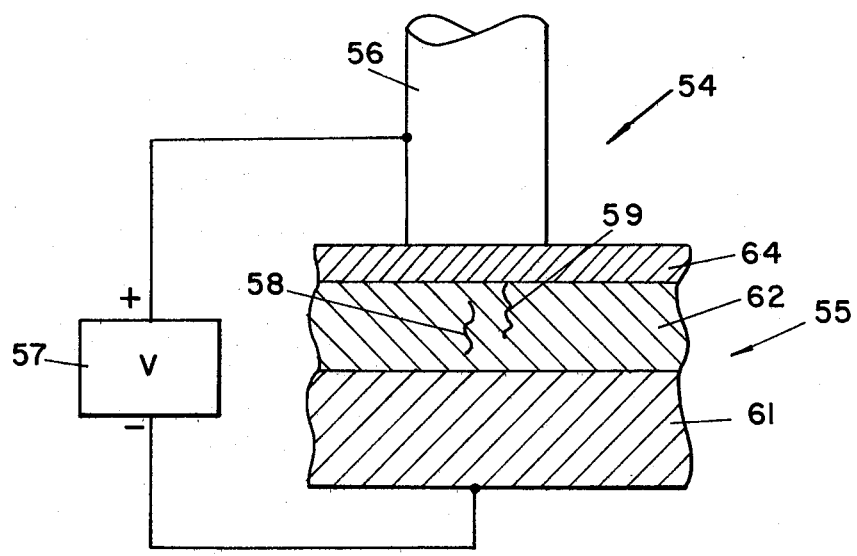
FIG. 4A is an enlarged, partly fragmentary and partly schematic side view of a latent short circuit converter embodying the present invention.

The operation of the short circuit converter 54, in accordance with a first embodiment of the present invention, is best understood by making reference to FIG. 4A. A partially completed device 55 includes a conductive substrate 61, for example formed from stainless steel, a semiconductor region 62 including at least one active region, wherein charge carriers can be photogenerated, and a layer 64 of conductive light transmissive or transparent material, such as indium tin oxide (ITO), formed thereon. An electrode 56 is applied to the ITO layer 64 or to a previously applied collection grid (not illustrated) and is coupled by a voltage source 57 to the substrate 61. The electrode 56 can be mechanically or fluidly applied to the device 55.

The semiconductor region 62 can include a plurality of latent short circuit defects of different types, two of which are illustrated. A first defect 58 is disposed entirely within the region 62 while a second defect 59 is within the region 62, but is connected to the ITO layer 64. It has been found that these defects can be converted to existing short circuit current defects during operation of a completed cell with all the detrimental effects of a preexisting short circuit current path.

The current invention converts the latent defects to existing defects so that they then can be eliminated prior to operation in the field. The latent defects can exhibit several different characteristics. Some defects are resistive only, some act as a forward or reverse junction (diode), some are combinations of resistive and photoconductive defects and some are combinations of resistive and junction type defects. The defects 58 and 59 are converted by applying a voltage pulse to the layer 62 by the voltage source 57 and the electrode 56. The voltage pulse can be in the range of $V_{oc}$ up to 10 volts per individual cell and thus can be in the range of 2 to 20 volts per two cell tandem device, applied for $10^{-3}$ to 5 seconds. Generally, a higher voltage requires less time than a lower voltage.

To insure that all the types of defects are converted, the voltage applied can be alternated in polarity and applied under illumination by light. This most severe case is not necessary under all conditions and can be varied for various applications. Thus, a forward or reverse bias can be utilized in the dark or with light. In any case, the latent defects are converted to existing short circuit defects which can then be eliminated as described hereinafter.

Figure 5:
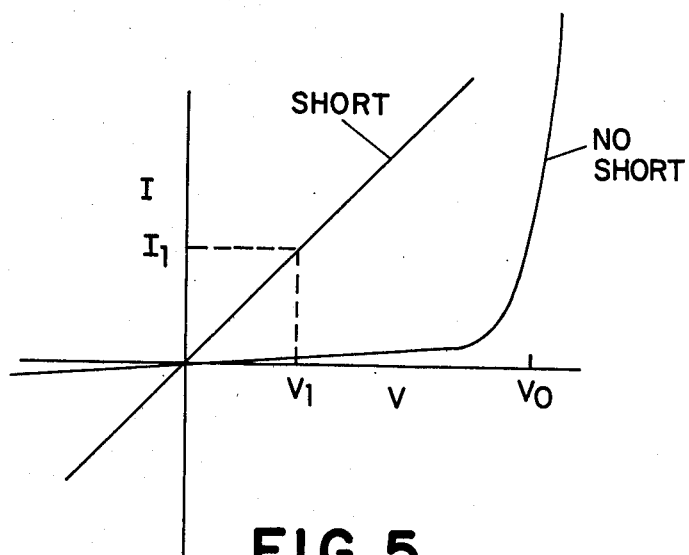
FIG. 5 is a dark I-V curve of a typical photovoltaic device which can be referred to for gaining a more complete understanding of the present invention.
Figure 4B:
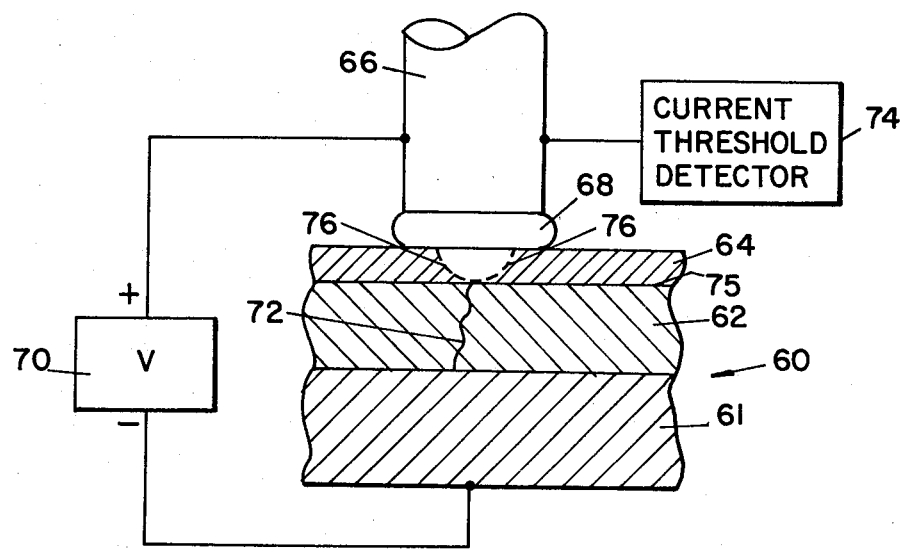
FIG. 4B is an enlarged, partly fragmentary and partly schematic side view of a short circuit detector and eliminator embodying the present invention.

The operation of the short circuit detector and eliminator 51, in accordance with one embodiment of the present invention as described in the parent application, can be best understood by making reference to FIGS. 4B and 5. In FIG. 4B, a partially completed device 60 including the conductive substrate 61, the semiconductor region 62 including at least one active region wherein charge carriers can be photogenerated, and the ITO layer 64 is disposed in close adjacent proximity to a conductive electrode 66. Between the electrode 66 and the ITO layer 64 is a source or bead 68 of conductive etchant electrolyte solution. The bead 68 makes discrete surface area contact with the ITO layer 64. In actual practice, a plurality of such electrodes and beads can be provided in side-by-side relation to detect and eliminate all of the short circuit current paths across the entire width and length of the device 60 or the electrode 66 can be elongated in configuration and, with the bead 68, extend across the entire width of the device 60.

A voltage source 70 is coupled between the substrate 61, which is at ground potential, and the electrode 66. The electrode 66 is made positive with respect to ground. As a result, in the case of a p-i-n type cell, the device 60 is biased in the reverse direction with the more positive voltage being applied to the conductive light transmissive material from source 70, through the electrode 66, and through the bead 68. The foregoing is also applicable to n-i-p type devices, but in this case the device would be biased in the forward direction.

The device 60, for illustrative purposes, has a short circuit current path 72 which extends through the semiconductor region 62 from the substrate 61 to the ITO layer 64. The path 72 can be a pre-existing path or can be a converted latent defect. If not eliminated, the short circuit current path, as previously mentioned, can seriously affect the output voltage of the device and thus its efficiency.

FIG. 5 illustrates how the short circuit current path 72 can be detected. As can be seen from the dark I-V curve of FIG. 5, if the applied voltage is for example $V_1$ which is less than the forward conduction bias voltage $V_0$, an area of the device 60 with no short circuit current paths under the bead 68 will conduct a very low current. However, when the short circuit current path advances under the bead 68, the rather low resistance provided by the short circuit current path 72 will cause a comparatively large current to flow. Hence, when the current through the device is above a predetermined level, a short circuit current path can be detected by a current threshold detector 74 which is coupled to the electrode 66.

To eliminate the short circuit current path 72, in accordance with the present invention, the resistivity of the current path 72 is increased substantially and selectively at the interface 75 between the ITO layer 64 and the semiconductor region 62 by isolating the ITO layer 64 from electrical connection with the short circuit current path 72. To accomplish this, the conductive etchant electrolyte forming the bead or source 68 is of the type which will attack or etch the ITO layer 64 when an electrical current flows therethrough. The solution can be, for example, a dilute acid, salt, or alkaline electrolyte solution. Acetic or hydrochloric acids are two preferable solutions. The current flowing through the bead 68, ITO layer 64, and the short circuit current path 72 causes the electrolyte to attack and etch the ITO layer 64.

The etching rate will be fastest in the areas of highest current density and will continue as long as there is sufficient current to sustain it. As a result, the etching will be concentrated at and around the short circuit current path 72 and will continue until sufficient ITO has been removed to isolate the ITO from the short circuit current path 72. Once the etching is completed, a discrete area of removed ITO results as indicated by the dashed lines 76. With the ITO thus removed, the remaining portions of the ITO layer 64 are effectively electrically isolated from the short circuit current path 72 and as a result, the short circuit current path 72 from the substrate 61 to the ITO layer 64 is eliminated.

One important feature of the foregoing method is that the etching process is self limiting. Only the amount of ITO necessary to eliminate the short circuit current paths will be removed, because once the short circuit current path is eliminated, there will not be any current flowing between the ITO material and bead 68 to sustain further etching. However, a small current will continue to flow through the bead 68 and short circuit current path 72.

For a conductive transparent material such as indium tin oxide, the electrolyte can be, for example, a 0.01% to 1% dilute hydrochloric acid solution of a 0.1 to 10% acetic acid solution. The current density through the solution can be $10^{-5}$ to $10^{-3}$ amperes per square centimeter and the etching time required to eliminate the short circuit current path is between 1 to 100 seconds depending on ITO thickness and temperature. The electrolyte can also be a dilute 0.05 molar NaCl solution. The current density through the solution can be 0.1 to 1 milliamperes and the etching time can be between 5 to 500 seconds depending on ITO thickness and temperature.

Figure 6:
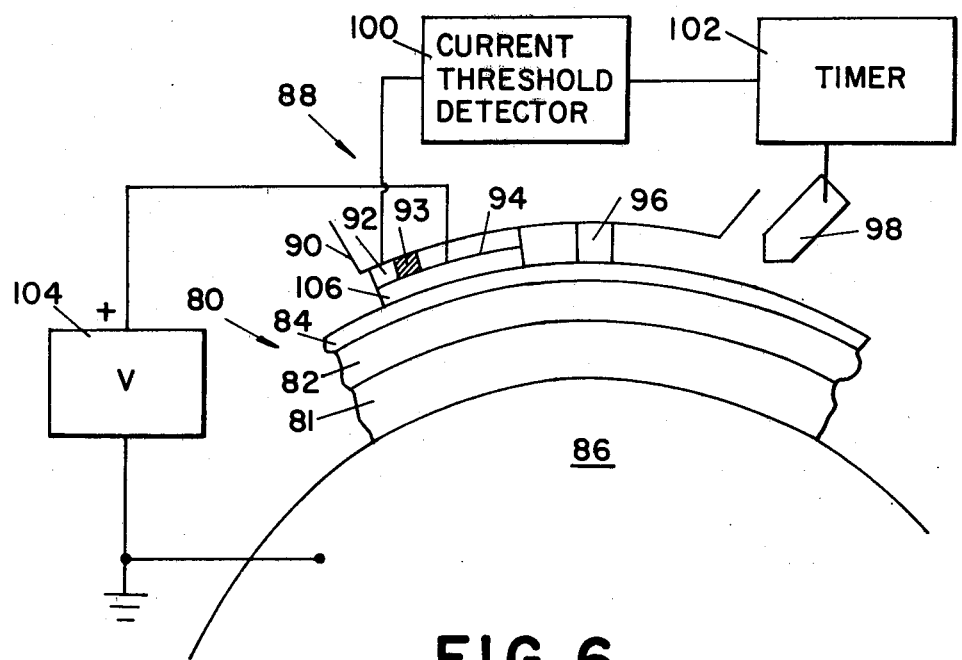
FIG. 6 is a partly schematic side view of another system embodying the present invention adapted for use in a continuous photovoltaic device production system.

FIG. 6 illustrates how the foregoing method can be incorporated in actual practice in a photovoltaic device continuous production process. As will become apparent, the apparatus of FIG. 6 further includes an applicator for applying an insulaing material to the discrete areas of the device which have been etched to eliminate short circuit current paths. This assures that the short circuit current paths will not contact a later applied grid electrode of the type previously discussed.

Referring now to FIG. 6 in greater detail, the photovoltaic device 80 which includes a conductive substrate 81, a semiconductor region 82 including at least one active region, and a layer 84 of transparent conductive material such as indium tin oxide (ITO) is continuously advanced over a drum 86 in close adjacent proximity to a short circuit current path detection and elimination station 88. The latent defects will be converted prior to the station 88.

The station 88 includes a mounting bracket 90 which supports an electrode 92, a metallic plate 94, an insulator 93 and a wiper 96. The station 88 also includes an applicator 98 mounted downstream of the wiper 96, and a current threshold detector 100 and timer 102 coupled in series between the electrode 92 and applicator 98. A source or bead 106 of conductive etchant electrolyte solution is also provided between the ITO layer 84, and the electrode 92 and plate 94. Lastly, a voltage source 104 is coupled between the drum 86 and the electrode 92 and plate 94.

In operation, when a discrete device area under the electrode 92 contains no short circuit current paths, the current through the source 104 will be insufficient to either trigger the current threshold detector 100 or cause any etching of the ITO layer 84. However, as previously explained with respect to the embodiment of FIG. 4B, when a short circuit current path advances under the electrode 92, there will be a sharp rise in current through the device from the drum 86, device 80, and electrolyte 106 to the electrode 92. This current will be above a predetermined value sufficient to trigger the current threshold detector 100. Upon being triggered, the current threshold detector sets timer 102.

As the short circuit current path is detected, the source 106 of etchant begins to etch the ITO layer 84 in the area of the short circuit current path. As the drum 86 turns, thereby advancing the device 80, the area of the device being etched travels in contact with the source 106 of etchant. The voltage of source 104 is also coupled to the plate 94 and maintains the current flow through the short circuit current path to sustain the etching process. The device 80 is advanced at a rate which assures sufficint ITO material to be removed for isolating the ITO layer 84 from the short circuit current path by the time the area of the short circuit current path exits the etchant source 106. As previously mentioned, since the etching process is self limiting, even though the short circuit current paths may be eliminated well before the area of the short circuit current path exits the source 106, only an amount of ITO material will be removed which is necessary for eliminating the short circuit current path.

Once the area of the short circuit current paths exits the source 106, it passes under a wiper 96 which removes excess etchant from the device. The wiper can be sponge-like, for example, and also apply a neutralizing solution to the device for neutralizing the etchant.

The area of the short circuit current path now proceeds along a path where it is exposed to a drying atmosphere allowing the device ITO to become completely dry. Once dried, the area of the device having the now eliminated short circuit current path passes beneath the applicator 98. The applicator 98, in response to the timer 102 set by the detector 100 applies a fixed amount of insulating material to the area of the ITO layer etched to eliminate the short circuit current paths. This precludes a later applied grid electrode from contacting the short circuit current paths.

As mentioned with respect to the embodiment of FIG. 4B, a plurality of side-by-side electrodes 92 can be provided for detecting the short circuit current paths followed by a single elongated plate 94 extending across the entire width of the device 80 for eliminating the short circuit current paths. In either case, all short circuit current paths across the entire width of the device can be detected and eliminated.

Figure 7:
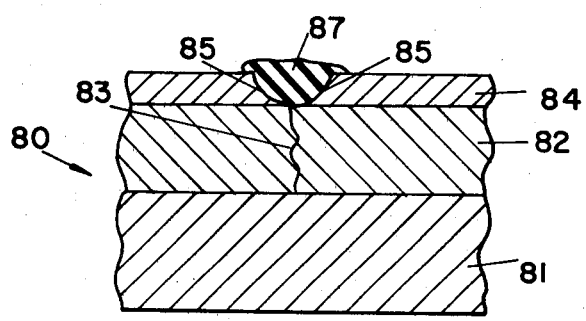
FIG. 7 is a fragmentary side view of a photovoltaic device after a short circuit current path has been detected and eliminated in accordance with the present invention.

FIG. 7 illustrates the structure of the device after being processed through the station of FIG. 6. As can be seen, the device 80 includes a conductive substrate 81, a semiconductor region 82 forming, for example, a p-i-n device wherein the intrinsic region is an active region, and a layer 84 of ITO. The device 80 also includes a now eliminated short circuit current path 83 which previously extended from the substrate 81, though region 82, and to the ITO layer 84. However, the short circuit current path 83 is now eliminated because the ITO layer 84 has been etched along lines 85 to isolate the short circuit current paths 83 from the ITO layer 84. Within the discrete area of the ITO layer 84 which has been etched away is a deposit of an insulating material 87 applied by the applicator 98. It is now assured that the short circuit current path has been completely eliminated and that it cannot be restored by inadvertently touching a later applied grid electrode.

Figure 8:
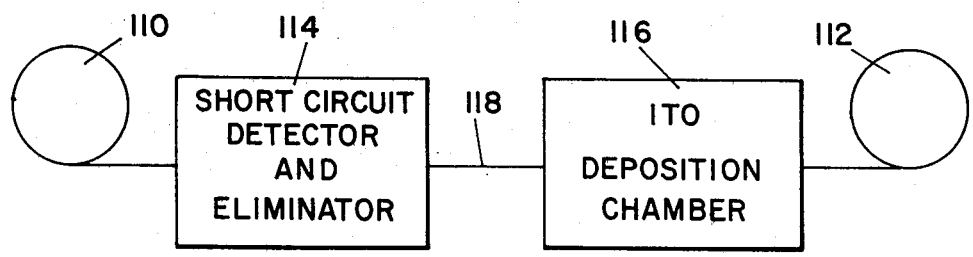
FIG. 8 is a schematic representation of a deposition chamber for forming the layer of light transmissive material after the short circuit current paths have been detected and eliminated in accordance with another embodiment of the present invention.

Referring now to FIG. 8, it illustrates that the short circuit current paths can be eliminated prior to the deposition of the conductive light transmissive material. Here, the devices 118 are carried on a supporting roll or core 110 and advanced into the short circuit detector and eliminator 114. As in the embodiment of FIG. 3, the devices 118 could be supplied directly from the system of FIG. 2 or a batch system instead of from the core 110 for making the system of FIG. 8 an integral part of the production system. The devices 118 are then advanced to chamber 116 where the devices receive the light tansmissive material over the last deposited semiconductor region. Lastly, the devices, after processing, can be wound onto a take-up core 112 which can be removed and transferred to a further station for final processing. The latent defects also can be converted without the light transmissive material by using the fluid coupled electrode.

Figure 9:
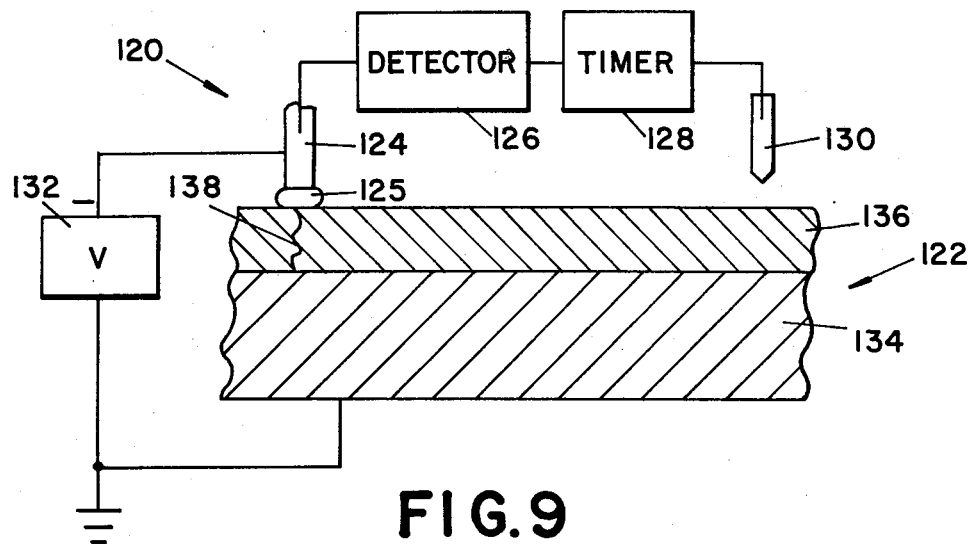
FIG. 9 is a partly schematic side view of another system embodying the present invention.

FIG. 9 illustrates one system 120 adapted for processing a device 122 in the short circuit detector and eliminator in accordance with the embodiment of FIG. 8. The system 120 includes an electrode 124, a current threshold detector 126, a timer 128, and an applicator 130. The system further includes a voltage source 132 and a bead 125 of electrolyte solution. The device includes a conductive substrate 134 and a semiconductor region 136 having a short circuit current path 138 extending from the substrate 134 through the semiconductor region 136.

The voltage source 132 is coupled on its positive side to the substrate 134 which is also at ground potential and on its negative side to the electrode 124 for maintaining the electrode at a negative potential with respect to the substrate. In the use of a p-i-n cell, this effectively forward biases the cell through the electrolyte bead 125. Reference to FIG. 5 will show that in the absence of a short circuit current path, a very small current will flow through the device and hence through the electrode 124 and electrolyte bead 125. However, if a short circuit current path such as short circuit current path 138 is received beneath the bead of electrolyte 125, there will be a sharp rise in current through the electrode 124 and electrolyte bead 125. This rise in current will be detected by the detector 126 which then sets timer 128.

Now that the short circuit current path 138 has been detected and located, the device 122 which has been continuously advanced toward the right will eventually be in a position so that the short circuit current path 138 is beneath the applicator 130. Here, the applicator, in response to timer 128, deposits a body of insulating material onto the semiconductor region 136 over an area including the short circuit current path 138. Now when the device receives the layer of conductive light transmissive material, such as ITO, in chamber 116 of FIG. 8, the ITO will be isolated electrically from the short circuit current path 138.

Figure 10:
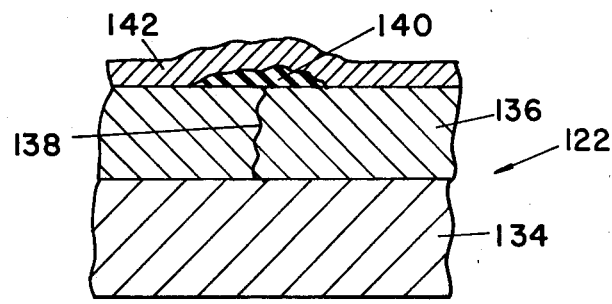
FIG. 10 is a fragmentary side view of a photovoltaic device after having a short circuit current path therein eliminated by the embodiments of FIGS. 8 and 9.

FIG. 10 illustrates the device 122 after this processing. The device 122 includes the aforementioned conductive substrate 134, semiconductor region 136, and short circuit current path 138. Deposited onto the semiconductor region 136 in an area including the short circuit current path 138 is a body of insulating material 140 deposited by applicator 130. Over the semiconductor region 136 and insulating material 140 is a layer of conductive light transmissive material 142 such as ITO. The insulating material 140 increases substantially the resistivity of the path between the short circuit current path 138 and ITO 142 at the interface between the ITO 142 and the semiconductor region 136. As a result, the ITO 142 is isolated electrically from the short circuit current path 138 effectively eliminating the short circuit current path 138.

It can also be noted from FIG. 5 that applying a reverse bias to a device to detect the presence and location of a short circuit current path is actually preferred. When a device is biased in the forward direction, there is the possibility that the device could go into forward conduction. This condition, which results in a sharp rise in current, could be mistaken by a current threshold detector for the presence of a short circuit current path. However, this is not possible with the reverse bias condition. As a result, for detecting the presence and location of a short circuit current path, reverse bias is preferred.

Figure 11:
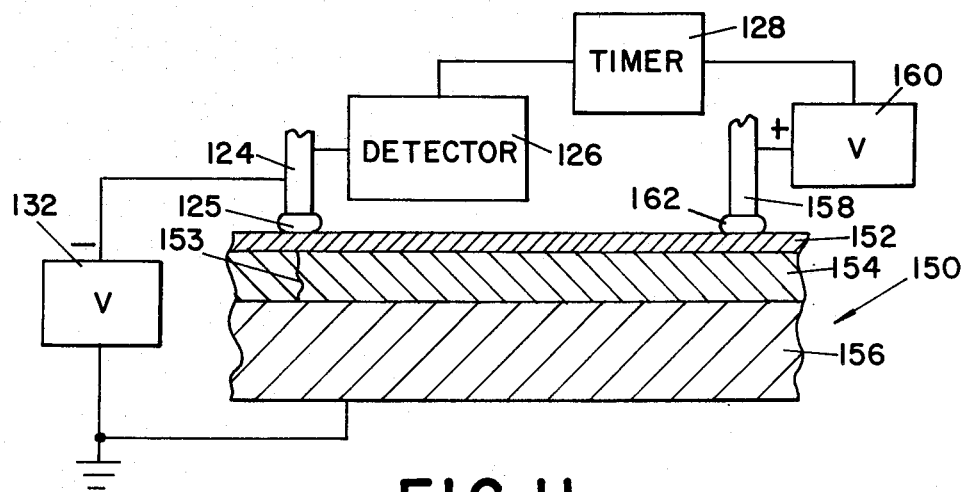
FIG. 11 is a partly schematic side view of another short circuit current path detecting and eliminating system embodying the present invention.

FIG. 11 shows a system which, like the embodiment of FIG. 9, utilizes a voltage potential across a device for detecting short circuit current paths which is also in the forward direction for the device. Here, the device 150 already includes an ITO layer 152 overlying a semiconductor region 154 which in turn overlies a conductive substrate 156. As in the previous embodiment, the system of FIG. 11 includes an electrode 124, a bead of electrolyte 125, a current threshold detector 126, a timer 128, and a voltage source 132 arranged to reverse bias the cell 150. Here, instead of an applicator, the system includes another electrode 158, a voltage source 160, and a bead of electrolyte 162. Again, the latent short circuit defects will already have been converted.

The voltage source 160 is arranged for applying a positive potential to electrode 158 when actuated by timer 128. As a result, when a short circuit current path 153 advances beneath electrode 158, the timer 128 which has been previously set by detector 126 will actuate the voltage source 160. The positive potential applied to the electrode 158 by the voltage source 160 will cause a current to flow through the short circuit current path 153 and ITO 152 to cause etching of the ITO as previously described to eliminate the short circuit current path.

In this embodiment, these electrodes are separate affording maximum control of the type and concentration of the electrolytes 125 and 162 and the magnitude and polarity of the voltages applied across and the current passed through the device. For example, the electrolyte 125 can be extremely dilute because it performs no etching function and thus need only be conductive while the electrolyte 162 can be less dilute because it does perform an etching function. Also, the current passed through the short circuit current path 153 caused by electrode 158 and voltage source 160 can be made substantially higher than that caused by electrode 124 and voltage source 132, because electrode 124 is associated with detection of short circuit current paths while electrode 158 is utilized to eliminate short circuit current paths. Higher currents can be utilized when short etching times are desired.

The alloy regions other than the intrinsic alloy regions ca be other than amorphous regions, such as polycrystalline regions. (By the term "amorphous" is meant an alloy or material which has long range disorder, although it may have short or intermediate order or even contain at times some crystalline inclusions.)

Modifications and variations of the present invention are possible in light of the above teachings. Particularly with a batch produced device, the electrode 66 and the bead 68 also can be indexed or swept across the device surface to produce the desired result. Also, the insulating material 87 need not be applied in all cases, such as where the grid electrode will not extend into the etched area to contact the short circuit current path. It is therefore, to be understood that within the scope of the appended claims the invention may be practiced otherwise than as specifically described.

What is claimed and desired to be secured by Letters Patent of the United States is:

1. In a process of making a photovoltaic device of the type including a semiconductor region overlying a substrate having an interface surface opposite said substrate and a layer of conductive light transmissive material overlying said semiconductor region interface surface, a method of actuating latent defects and then eliminating the actuated as well as pre-existing short circuit current paths extending from said substrate through said semiconductor region to said interface surface comprising:
    applying an electrical bias to said device to convert said latent defects to actuated short circuit current paths and thereafter increasing substantially the resistivity of said actuated and pre-existing short circuit current paths selectively at the interface surface of said semiconductor region.

2. The method as defined in claim 1 wherein said bias is applied at a voltage between about two volts and ten volts.

3. The method as defined in claim 1 wherein said applying a bias to said device includes applying a reverse bias.

4. The method as defined in claim 1 wherein said applying a bias to said device includes applying an alternating forward and reverse bias.

5. The method as defined in claim 1 wherein said applying a bias includes applying said bias while illuminating said device.

6. The method as defined in claim 1 wherein said applying a bias includes applying a voltage of between the open circuit voltage of said device and up to ten volts per individual cell.

7. The method as defined in claim 1 including depositing the layer of conductive light transmissive material prior to applying said bias.

8. The method as defined in claim 7 wherein said step of increasing substantially the resistivity of said short circuit current path includes isolating said short circuit current path electrically from said conductive light transmissive material.

9. The method as defined in claim 8 wherein said step of isolating said conductive light transmissive material from said short circuit current path includes removing said conductive light transmissive material from electrical connection with said short circuit current path.

10. The method as defined in claim 9 wherein said removing step includes etching said conductive light transmissive material from contact with said short circuit current path.

11. The method as defined in claim 10 wherein said etching step includes applying an electrolyte solution to said conductive light transmissive material in the area of said short circuit current path and passing a current through said short circuit current path and said electrolyte.

12. The method as defined in claim 11 wherein said step of passing said current through said short circuit current path includes applying a voltage potential between said electrolyte and said substrate.

13. The method as defined in claim 12 wherein said step of applying said voltage potential includes maintaining said electrolyte positive with respect to said substrate.

14. The method as defined in claim 13 wherein said electrolyte solution is one of an acid, salt, or alkaline solution.

15. The method as defined in claim 14 wherein said electrolyte solution is a dilute solution.

16. The method as defined in claim 9 further comprising depositing an insulating material onto said semiconductor region over the area in which said conductive light transmissive material has been removed.

17. The method as defined in claim 1 comprising the initial step of locating said short circuit current path and thereafter increasing substantially the resistivity of said path.

18. The method as defined in claim 17 wherein said step of increasing the resistivity of said path includes depositing an insulating material on said semiconductor interface surface in an area including said located short circuit current path and then depositing the conductive light transmissive material.

19. The method as defined in claim 17 wherein said step of locating said short circuit current path includes applying a voltage potential between discrete areas of said semiconductor region and said substrate, and detecting when the current through said semiconductor region exceeds a predetermined limit.

20. The method as defined in claim 19 wherein said locating step further includes applying said voltage potential to said conductive light transmissive material through an electrolyte solution making discrete area surface contact therewith.

21. The method as defined in claim 19 wherein said locating step further includes applying said voltage potential to said semiconductor region through an electrolyte solution making discrete area surface contact therewith.

* * * * *